United States Patent
Wong et al.

(10) Patent No.: US 6,809,277 B2
(45) Date of Patent: Oct. 26, 2004

(54) METHOD FOR REGISTERING A DEPOSITED MATERIAL WITH CHANNEL PLATE CHANNELS, AND SWITCH PRODUCED USING SAME

(75) Inventors: Marvin Glenn Wong, Woodland Park, CO (US); Paul Thomas Carson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 2 days.

(21) Appl. No.: 10/349,712

(22) Filed: Jan. 22, 2003

(65) Prior Publication Data

US 2004/0140187 A1 Jul. 22, 2004

(51) Int. Cl.$^7$ ............................................... H01H 29/00
(52) U.S. Cl. ....................................... 200/182; 200/188
(58) Field of Search ................................ 200/181–286, 200/61.02; 219/209, 210; 310/328, 363, 365

(56) References Cited

U.S. PATENT DOCUMENTS

| | | |
|---|---|---|
| 2,312,672 A | 3/1943 | Pollard, Jr. |
| 2,564,081 A | 8/1951 | Schilling |
| 3,430,020 A | 2/1969 | Tomkewitsch et al. |
| 3,529,268 A | 9/1970 | Rauterberg |
| 3,600,537 A | 8/1971 | Twyford |
| 3,639,165 A | 2/1972 | Rairden, III |
| 3,657,647 A | 4/1972 | Beusman et al. |
| 4,103,135 A | 7/1978 | Gomez et al. |
| 4,200,779 A | 4/1980 | Zakurdaev et al. |
| 4,238,748 A | 12/1980 | Goullin et al. |
| 4,245,886 A | 1/1981 | Kolodzey et al. |
| 4,336,570 A | 6/1982 | Brower |
| 4,419,650 A | 12/1983 | John |
| 4,434,337 A | 2/1984 | Becker |
| 4,475,033 A | 10/1984 | Willemsen et al. |
| 4,505,539 A | 3/1985 | Auracher et al. |
| 4,582,391 A | 4/1986 | Legrand |
| 4,628,161 A | 12/1986 | Thackrey |
| 4,652,710 A | 3/1987 | Karnowsky et al. |
| 4,657,339 A | 4/1987 | Fick |
| 4,742,263 A | 5/1988 | Harnden, Jr. et al. |
| 4,786,130 A | 11/1988 | Georgiou et al. |
| 4,797,519 A | 1/1989 | Elenbaas |
| 4,804,932 A | 2/1989 | Akanuma et al. |

(List continued on next page.)

FOREIGN PATENT DOCUMENTS

| | | |
|---|---|---|
| EP | 0593836 A1 | 4/1994 |
| FR | 2418539 | 9/1979 |
| FR | 2458138 | 12/1980 |
| FR | 2667396 | 4/1992 |
| JP | 62-276838 | 12/1987 |
| JP | 63-294317 | 12/1988 |
| JP | 8-125487 | 5/1996 |
| WO | WO99-46624 | 9/1999 |

OTHER PUBLICATIONS

Marvin Glenn Wong, "A Piezoelectrically Actuated Liquid Metal Switch", patent appication Ser. No. 10/137,691, filed May 2, 2002, 12 pages of specification, 5 pages of claims, 1 page of abstract, and 10 sheets of drawing (Figs. 1–10).

(List continued on next page.)

*Primary Examiner*—Michael Friedhofer
*Assistant Examiner*—Lisa Klaus

(57) ABSTRACT

A method for depositing material on a channel plate such that the material is registered to one or more channels formed in the channel plate includes filling at least one of the channels with a resist that is not wetted by the material; depositing the material on at least a region of the channel plate that includes at least part of the resist; and then removing the resist. The method may be used, in one embodiment, to apply an adhesive or gasket material that is used in assembling a switch.

12 Claims, 5 Drawing Sheets

U.S. PATENT DOCUMENTS

| | | |
|---|---|---|
| 4,988,157 A | 1/1991 | Jackel et al. |
| 5,278,012 A | 1/1994 | Yamanaka et al. |
| 5,415,026 A | 5/1995 | Ford |
| 5,502,781 A | 3/1996 | Li et al. |
| 5,644,676 A | 7/1997 | Blomberg et al. |
| 5,675,310 A | 10/1997 | Wojnarowski et al. |
| 5,677,823 A | 10/1997 | Smith |
| 5,751,074 A | 5/1998 | Prior et al. |
| 5,828,799 A | 10/1998 | Donald |
| 5,841,686 A | 11/1998 | Chu et al. |
| 5,849,623 A | 12/1998 | Wojnarowski et al. |
| 5,874,770 A | 2/1999 | Saia et al. |
| 5,875,531 A | 3/1999 | Nellissen et al. |
| 5,889,325 A | 3/1999 | Uchida et al. |
| 5,912,606 A | 6/1999 | Nathanson et al. |
| 5,915,050 A | 6/1999 | Russell et al. |
| 5,994,750 A | 11/1999 | Yagi |
| 6,021,048 A | 2/2000 | Smith |
| 6,180,873 B1 | 1/2001 | Bitko |
| 6,201,682 B1 | 3/2001 | Mooij et al. |
| 6,207,234 B1 | 3/2001 | Jiang |
| 6,212,308 B1 | 4/2001 | Donald |
| 6,225,133 B1 | 5/2001 | Yamamichi et al. |
| 6,278,541 B1 | 8/2001 | Baker |
| 6,304,450 B1 | 10/2001 | Dibene, II et al. |
| 6,320,994 B1 | 11/2001 | Donald et al. |
| 6,323,447 B1 | 11/2001 | Kondoh et al. |
| 6,351,579 B1 | 2/2002 | Early et al. |
| 6,356,679 B1 | 3/2002 | Kapany |
| 6,373,356 B1 * | 4/2002 | Gutierrez et al. .............. 335/47 |
| 6,396,012 B1 | 5/2002 | Bloomfield |
| 6,396,371 B2 | 5/2002 | Streeter et al. |
| 6,408,112 B1 | 6/2002 | Bartels |
| 6,446,317 B1 | 9/2002 | Figueroa et al. |
| 6,453,086 B1 | 9/2002 | Tarazona |
| 6,470,106 B2 | 10/2002 | McClelland et al. |
| 6,487,333 B2 | 11/2002 | Fouquet et al. |
| 6,501,354 B1 | 12/2002 | Gutierrez et al. |
| 6,516,504 B2 | 2/2003 | Schaper |
| 6,548,779 B2 * | 4/2003 | Takahashi et al. .......... 200/516 |
| 6,559,420 B1 | 5/2003 | Zarev |
| 6,633,213 B1 * | 10/2003 | Dove .......................... 335/78 |
| 2002/0037128 A1 | 3/2002 | Burger et al. |
| 2002/0146197 A1 | 10/2002 | Yong |
| 2002/0150323 A1 | 10/2002 | Nishida et al. |
| 2002/0168133 A1 | 11/2002 | Saito |
| 2003/0035611 A1 | 2/2003 | Shi |

OTHER PUBLICATIONS

Marvin Glenn Wong, "Laser Cut Channel Plate for a Switch", patent application Ser. No. 10/317,932, filed Dec. 12, 2002, 11 pages of specification, 5 pages of claims, 1 page of abstract, and 4 sheets of drawings (Figs. 1–10).

TDB–ACC–NO: NB8406827, "Integral Power Resistors For Aluminum Substrate", IBM Technical Disclosure Bulletin, Jun. 1984, US, vol. 27, Issue No. 1B, p. 827.

Bhedwar, Horni C., et al., "Ceramic Multilayer Package Fabrication", Electronic Materials Handbook, Nov. 1989, pp 460–469, vol. 1 Packaging, Section 4: Packages.

* cited by examiner

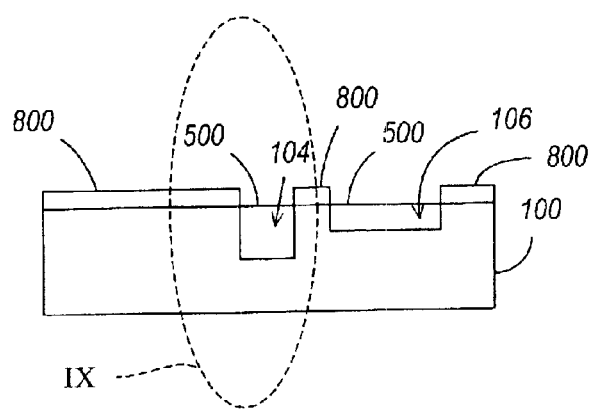
FIG. 8
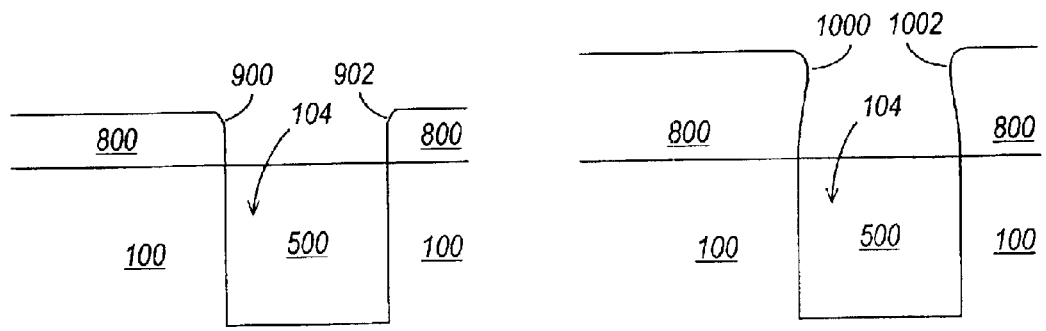
FIG. 9
FIG. 10
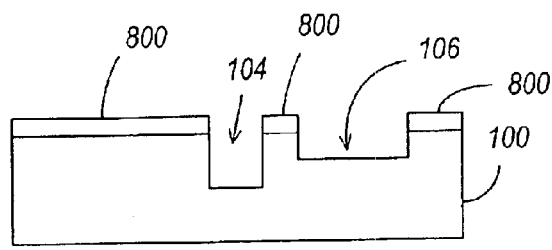
FIG. 11
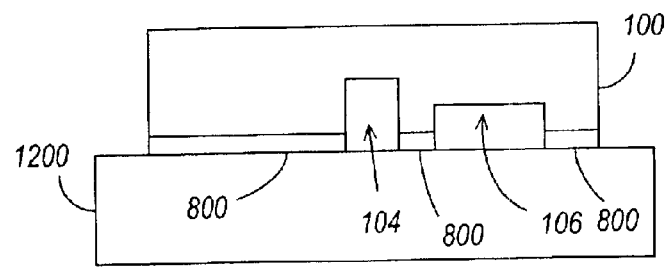
FIG. 12

FIG. 13
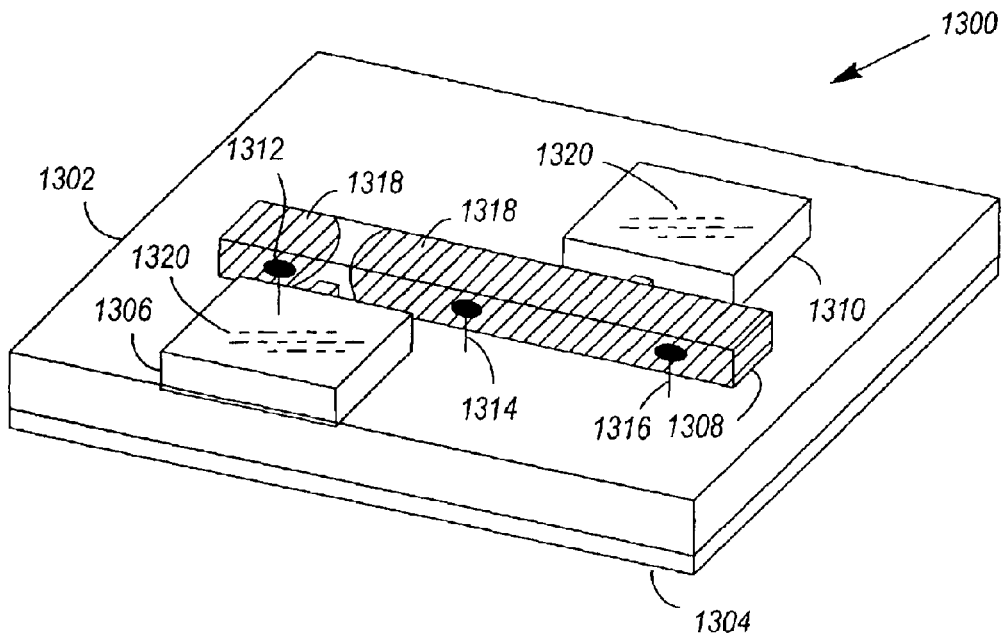
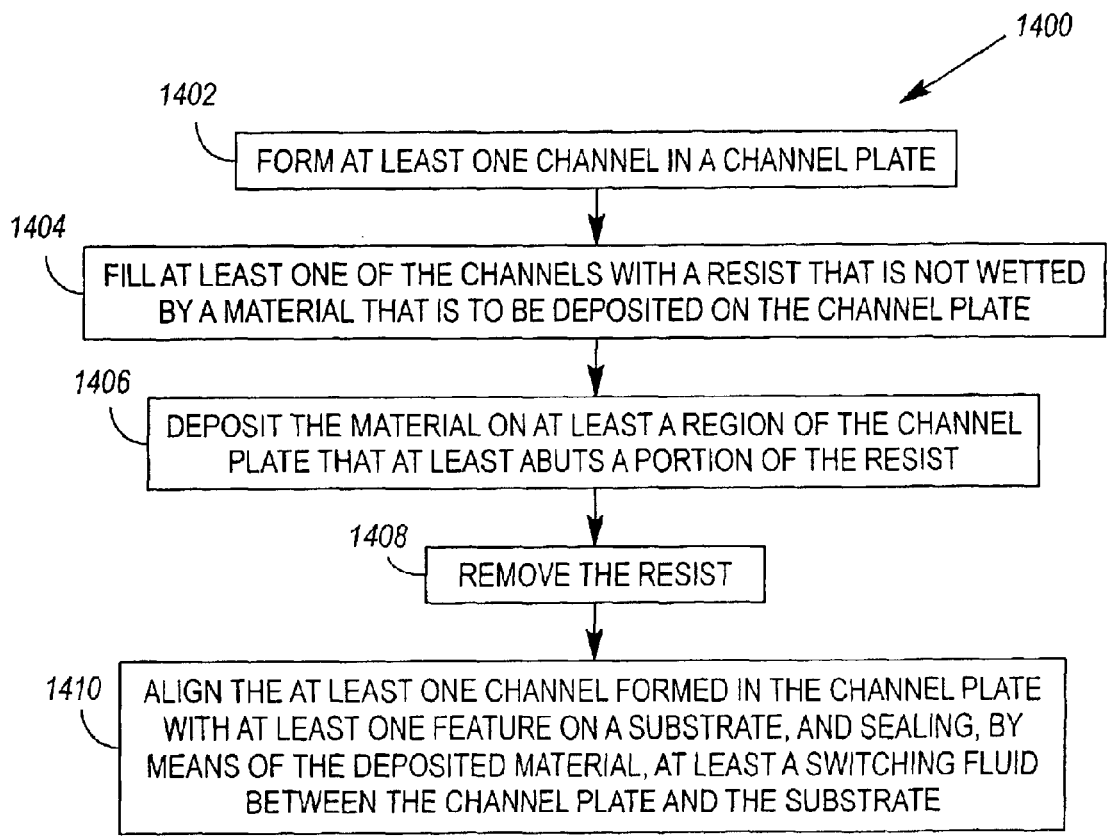
FIG. 14

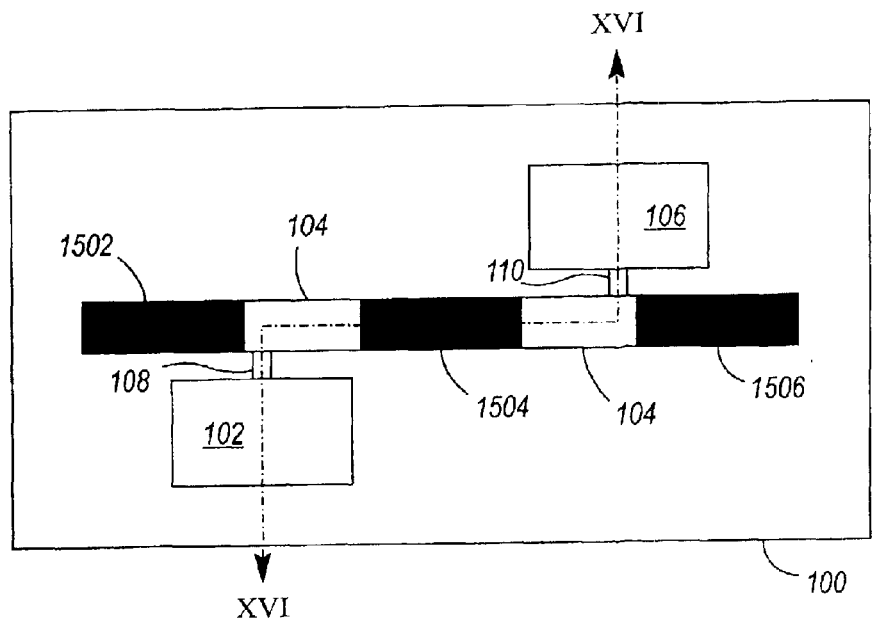
FIG. 15
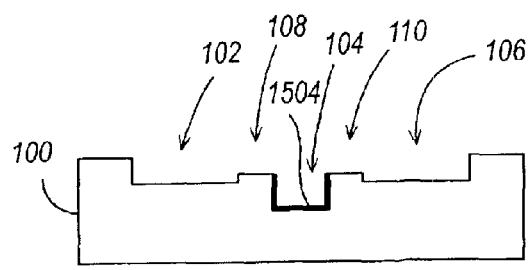
FIG. 16
FIG. 17
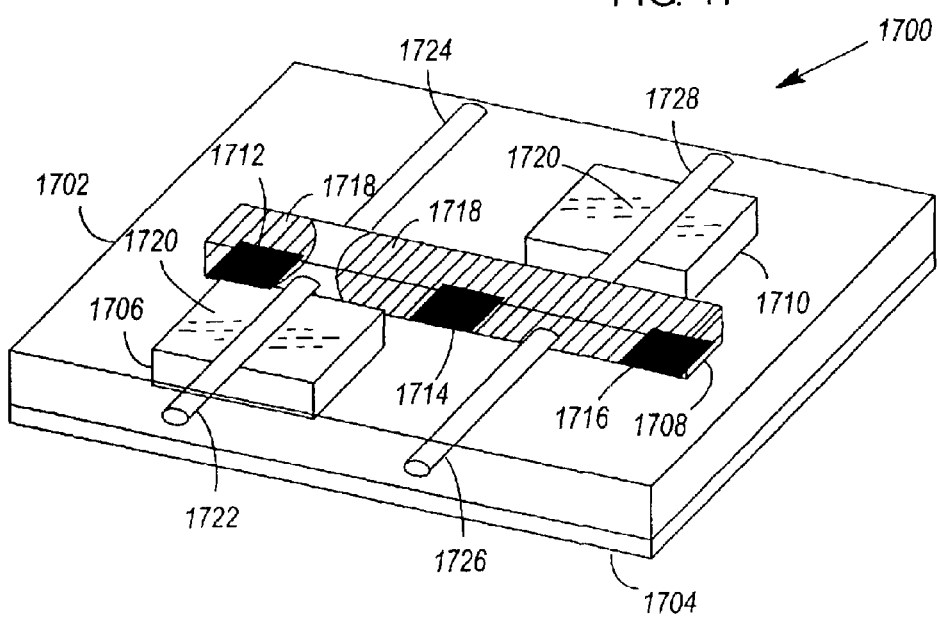

US 6,809,277 B2

METHOD FOR REGISTERING A DEPOSITED MATERIAL WITH CHANNEL PLATE CHANNELS, AND SWITCH PRODUCED USING SAME

BACKGROUND

Fluid-based switches such as liquid metal micro switches (LIMMS) are disclosed in the following patent and patent applications (the teachings of which are hereby incorporated by reference): U.S. Pat. No. 6,323,447 of Kondoh et al. entitled "Electrical Contact Breaker Switch, Integrated Electrical Contact Breaker Switch, and Electrical Contact Switching Method"; U.S. patent application of Marvin Glenn Wong entitled "A Piezoelectrically Actuated Liquid Metal Switch" (Ser. No. 10/137,691, filed May 2, 2002); and U.S. patent application of Marvin Glenn Wong entitled "Laser Cut Channel Plate for a Switch" (Ser. No. 10/317,932, filed Dec. 12, 2002).

One way to manufacture the switches disclosed in the above-referenced patent and patent applications is to 1) deposit an adhesive on a channel plate, and then 2) seal the desired combination of switching fluid(s), actuating fluid(s) and/or other switch components between the channel plate and a substrate.

When depositing the adhesive on the channel plate, it is typically desirable to "register" the adhesive with the channels of the channel plate. That is, it is desirable to deposit the adhesive on the channel plate so that it extends precisely up to, but not into, the channels of the channel plate. In this manner, the adhesive does not contribute to increasing or decreasing the volumes of cavities that are defined by the channels when the channel plate is sealed to the substrate.

SUMMARY OF THE INVENTION

One aspect of the invention is embodied in a method for depositing material on a channel plate such that the material is registered to one or more channels formed in the channel plate. The method comprises 1) filling at least one of the channels with a resist that is not wetted by the material, 2) depositing the material on at least a region of the channel plate that at least abuts a portion of the resist, and then 3) removing the resist.

Another aspect of the invention is embodied in a switch produced by 1) forming at least one channel in a channel plate, 2) filling at least one of the channels with a resist that is not wetted by a material that is to be applied to the channel plate, 3) depositing the material on at least a region of the channel plate that at least abuts a portion of the resist, 4) removing the resist, and 5) aligning the at least one channel formed in the channel plate with at least one feature on a substrate, and sealing, by means of the deposited material, at least a switching fluid between the channel plate and the substrate.

Other embodiments of the invention are also disclosed.

BRIEF DESCRIPTION OF THE DRAWINGS

Illustrative embodiments of the invention are illustrated in the drawings, in which:

FIG. 8 illustrates the deposition of a material on the FIG. 1 channel plate while the channels of the channel plate are filled with a resist;

FIG. 9 illustrates the rounding of deposited material corners at the edges of a channel plate channel filled with resist;

FIG. 10 illustrates the leaning of deposited material edges at the edges of a channel plate channel filled with resist;

FIG. 11 illustrates the channel plate cross-section shown in FIG. 8, after the resist has been removed from the channel plate's channels;

FIG. 12 illustrates how the FIG. 1 channel plate may be sealed to a substrate;

FIG. 13 illustrates a first exemplary embodiment of a switch;

FIG. 14 illustrates an exemplary method for producing the switch illustrated in FIG. 13;

FIGS. 15 & 16 illustrate the metallization of portions of the FIG. 1 channel plate; and FIG. 17 illustrates a second exemplary embodiment of a switch.

DETAILED DESCRIPTION OF THE INVENTION

When depositing material on a channel plate, it is sometimes desirable to register the material with one or more channels that are formed in the channel plate. That is, it is sometimes desirable to deposit material on a channel plate such that it extends precisely up to, but not into, the channels of the channel plate.

Fluid-based switches represent one application in which channel registration of a material is desirable. For example, during the manufacture of a switch in accordance with the patent and patent applications disclosed in the Background section of this disclosure, an adhesive may be applied to a channel plate for the purpose of sealing the channel plate to a substrate. Between the channel plate and substrate are sealed a combination of switching fluid(s), actuating fluid(s) and/or other switch components. When depositing the adhesive on the channel plate, it is typically desirable to register the adhesive with the channels of the channel plate so that the adhesive does not increase or decrease the volumes of cavities that are defined by the channels when the channel plate is sealed to the substrate.

One way to register an adhesive with the channels of a channel plate is to deposit a layer of adhesive on the channel plate, partially cure it, deposit a layer of photoresist on top of the adhesive, photodefine the photoresist layer, and then sandblast the adhesive from the channel plate's channels. However, disadvantages of this process include 1) relatively large tolerances in adhesive channel registration, as well as 2) rough channel surfaces as a result of the sandblasting. The process also places limits on the types of substrates that may be used for the channel plate, as well as the geometries of channel structures that can be accommodated.

The inventors have therefore devised new methods for depositing material on a channel plate, as well as new switches that are produced in accordance with the methods. The new methods provide better registration of deposited materials to the channel or channels that have been formed in the channel plate.

Figure 1:
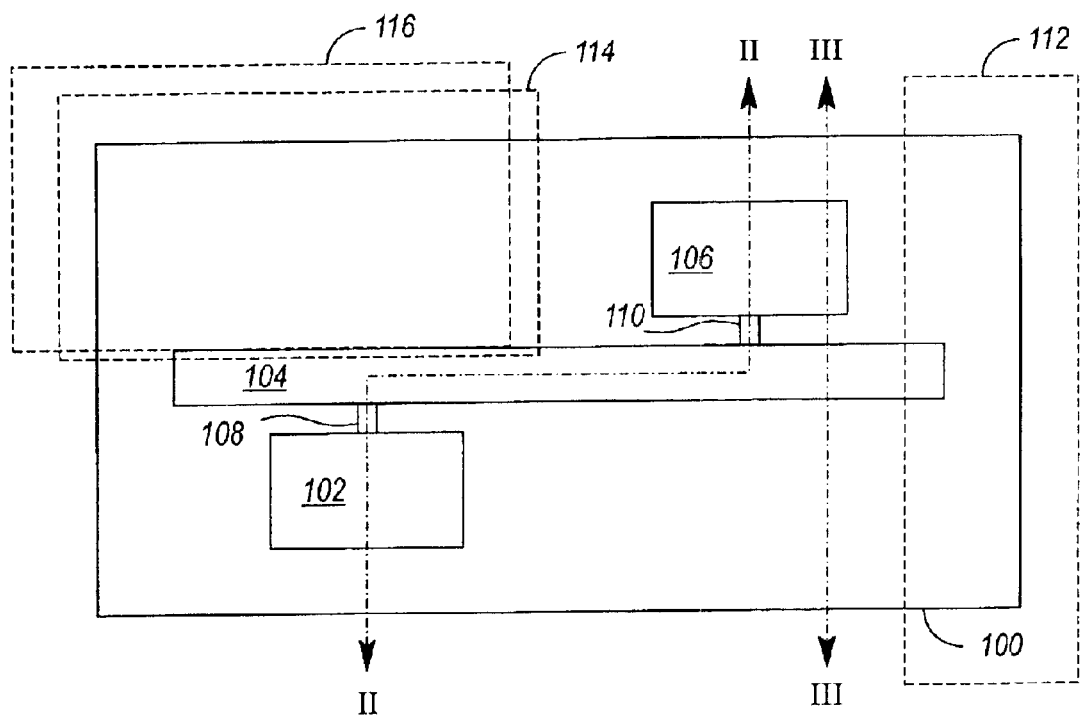
FIG. 1 illustrates an exemplary plan view of a channel plate for a switch.
Figure 2:
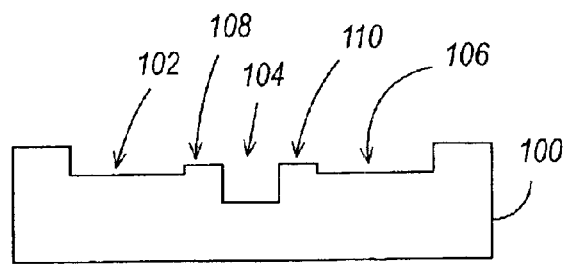
FIG. 2 illustrates a first cross-section of the FIG. 1 channel plate.
Figure 3:
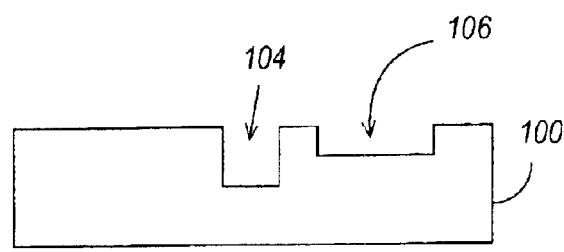
FIG. 3 illustrates a second cross-section of the FIG. 1 channel plate.

FIGS. 1–3 illustrate a first exemplary embodiment of a channel plate 100. FIG. 1 illustrates a plan view of the channel plate 100, while FIGS. 2 & 3 illustrate two exemplary cross-sections of the channel plate 100. Such a channel plate might be used, for example, in a fluid-based switch such as a LIMMS. By way of example, the channel plate 100 is shown to comprise five different channels 102, 104, 106, 108, 110 of varying depths. However, it is envisioned that more or fewer channels may be formed in a channel plate, depending on the configuration of the switch in which the channel plate is to be used. The base material for the channel plate 100 may be glass, ceramic, metal or polymer, to name a few. Depending on the base material used and the channel tolerances desired, channels may be machined, injection molded, press molded, slump molded, etched, laser cut, ultrasonically milled, laminated, stamped or otherwise formed in a channel plate 100.

For the purpose of this description, "channel" is defined to be any sort of groove, trough, pit or other feature that creates a recess in a channel plate that extends below the uppermost surface of the channel plate.

Figure 4:
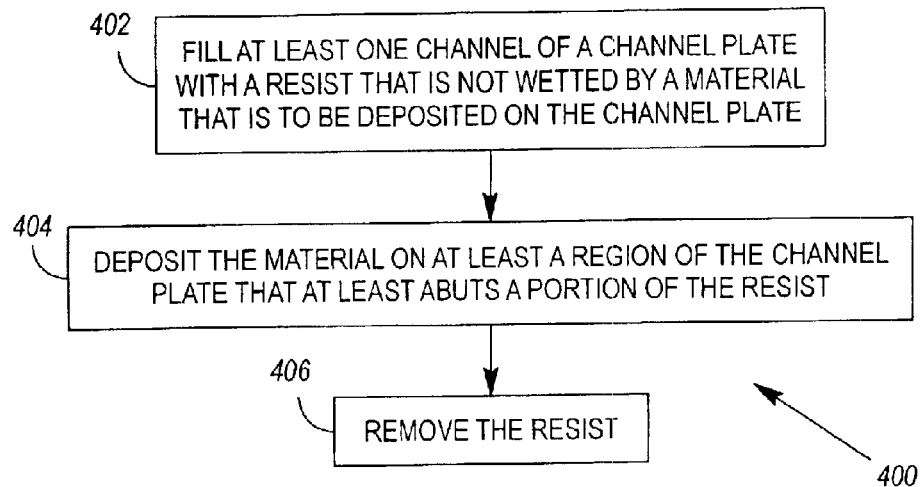
FIG. 4 illustrates a method for depositing material on a channel plate such that the material is registered to one or more channels formed in the FIG. 1 channel plate.

In accordance with the invention, FIG. 4 illustrates a method 400 for depositing material on a channel plate 100 so that the deposited material is registered to one or more channels 102–110 formed in the channel plate 100. The method 400 comprises filling 402 at least one of the channel plate's channels 102–110 with a resist that is not wetted by the material that is to be deposited on the channel plate 100. Although it is envisioned that all of a channel plate's channels 102–110 will typically be filled with the resist, there may be applications in which it might be desirable to fill or coat some of a channel plate's channels with a deposited material. In these applications, the channels that are to be filled or coated with the deposited material are not filled with the resist.

Figures 5, 6:
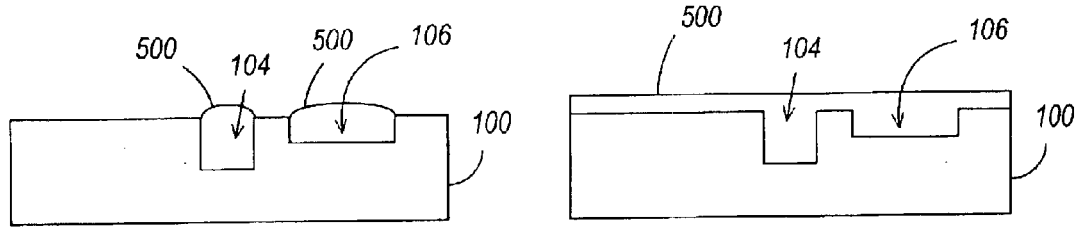
FIGS. 5 & 6 illustrate how channels of the FIG. 1 channel plate may be filled with a resist.

Channels 104, 106 may be filled with resist 500 as shown in FIG. 5 or 6, for example. In FIG. 5, a resist 500 is applied only to a channel plate's channels 104, 106. Alternatively, and as shown in FIG. 6, a resist 500 may be applied to an entire surface of a channel plate 100 such that it extends beyond the boundaries of a channel plate's channels 104, 106. Although application of a resist 500 as shown in FIG. 6 requires that portions of the resist 500 that fall outside of the channel plate's channels 104, 106 be removed prior to the next step of the FIG. 4 method, application of a resist 500 as shown in FIG. 6 may be easier and quicker than application of a resist 500 as shown in FIG. 5.

Figure 7:
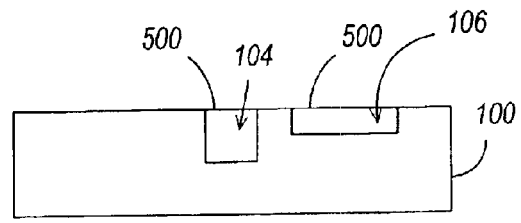
FIG. 7 illustrates the channel plate of FIG. 5 or 6, after abrasion.

Regardless of how a resist 500 is applied to a channel plate 100, it may be desirable to abrade the channel plate to make the resist 500 planar with the surface of the channel plate 100, or to better define transitions between the resist 500 and the edges of channels 104, 106 that are filled with the resist 500. Following abrasion, the channel plates 100 with resist 500 shown in FIGS. 5 and 6 may appear as illustrated in FIG. 7.

By way of example, a channel plate 100 may be abraded by means of chemical mechanical planarization, or grinding and polishing.

Although a channel plate 100 may be abraded solely for the purpose of removing excess resist 500, a channel plate 100 may also be abraded for the purpose of flattening the surface or surfaces of the channel plate bearing resist-filled channels 104, 106. If the material to be deposited on a channel plate 100 is an adhesive or gasket material, flattening the channel plate 100 may help the channel plate 100 achieve a better bond to (or fit with) a part to which it is later mated.

After filling one or more channels 104, 106 with a resist 500, a desired material 800 is deposited 404 (FIG. 4) on at least a region of the channel plate 100 that at least abuts a portion of the resist 500 (see FIG. 8). In other words, the material 800 need not be deposited over the entirety of a channel plate's surface, nor need the material 800 be deposited over a region of the channel plate 100 encompassing the entirety of a resist filled channel 104. Thus, for example, the material 800 may be deposited over a region 112 encompassing one end of a channel 104 that is filled with resist 500 (see FIG. 1), or the material 800 may be deposited primarily on one side 114, 116 of a channel 104 that is filled with resist 500. Alternately, the material 800 may be deposited over the entirety of one or more of a channel plate's surfaces.

By way of example, a material layer 800 may be deposited on a channel plate 100 by means of spin coating or spray coating. Since the resist 500 is selected so as not to be wetted by the material 800 that is deposited on the channel plate 100, and as a result of the deposited material's surface tension, the deposited material 800 will only extend up to the borders of the resist 500. Thus, if the resist 500 is precisely registered to the boundaries of a channel plate's channels 104, 106, so too will the deposited material 800 be registered to the boundaries of the channels 104, 106.

FIG. 9 illustrates how the corners 900, 902 of a deposited material 800 can "round" at the boundaries of a channel plate channel 104. This effect may be accentuated as the thickness of the deposited material 800 increases. If desired, the deposited material 800 may be abraded to remove that portion of the material where rounding is present.

FIG. 10 illustrates a possibly undesirable effect of depositing too thick of a material layer 800 on a channel plate 100. As shown in FIG. 10, a layer 800 that is too thick may "lean" over a channel plate channel 104. Again, the deposited material 800 may be abraded to remove that portion of the material that leans excessively. Alternately, a thinner layer of material 800 may be deposited on the channel plate 100.

After the material 800 has been deposited, the resist 500 may be removed 406 (see FIG. 11). By way of example, the resist 500 may be removed using an etching or developing process. Depending on the nature of the deposited material 800, and the process used to remove the resist 500, it may be necessary to cure the deposited material 800 prior to removing the resist 500. The curing may be achieved by exposing the deposited material 800 to ambient conditions for a period of time, by heating the deposited material 800, by submersing the deposited material 800 in an appropriate solution, or by other means. If necessary, the deposited material 800 may also be cured (or cured further) after the resist 500 is removed.

If desired, the channel plate 100, with deposited material 800 thereon, may be mated to another part (e.g., in the case of a fluid-based switch wherein the deposited material 800 is an adhesive or gasket, the part to which the channel plate 100 is mated may be a switch substrate 1200 (FIG. 12)).

Given that fluid-based switch manufacture is one potential and intended application for the FIG. 4 method, some exemplary fluid-based switches to which the FIG. 4 method can be applied will now be described.

FIG. 13 illustrates a first exemplary embodiment of a switch 1300. The switch 1300 comprises a channel plate 1302 defining at least a portion of a number of cavities 1306, 1308, 1310. The remaining portions of the cavities 1306–1310, if any, may be defined by a substrate 1304 to which the channel plate 1302 is sealed. Exposed within one or more of the cavities are a plurality of electrodes 1312, 1314, 1316. A switching fluid 1318 (e.g., a conductive liquid metal such as mercury) held within one or more of the cavities serves to open and close at least a pair of the plurality of electrodes 1312–1316 in response to forces that are applied to the switching fluid 1318. An actuating fluid 1320 (e.g., an inert gas or liquid) held within one or more of the cavities serves to apply the forces to the switching fluid 1318.

In one embodiment of the switch 1300, the forces applied to the switching fluid 1318 result from pressure changes in the actuating fluid 1320. The pressure changes in the actuating fluid 1320 impart pressure changes to the switching fluid 1318, and thereby cause the switching fluid 1318 to change form, move, part, etc. In FIG. 13, the pressure of the actuating fluid 1320 held in cavity 1306 applies a force to part the switching fluid 1318 as illustrated. In this state, the rightmost pair of electrodes 1314, 1316 of the switch 1300 are coupled to one another. If the pressure of the actuating fluid 1320 held in cavity 1306 is relieved, and the pressure of the actuating fluid 1320 held in cavity 1310 is increased, the switching fluid 1318 can be forced to part and merge so that electrodes 1314 and 1316 are decoupled and electrodes 1312 and 1314 are coupled.

By way of example, pressure changes in the actuating fluid 1320 may be achieved by means of heating the actuating fluid 1320, or by means of piezoelectric pumping. The former is described in U.S. Pat. No. 6,323,447 of Kondoh et al. entitled "Electrical Contact Breaker Switch, Integrated Electrical Contact Breaker Switch, and Electrical Contact Switching Method". The latter is described in U.S. patent application Ser. No. 10/137,691 of Marvin Glenn Wong filed May 2, 2002 and entitled "A Piezoelectrically Actuated Liquid Metal Switch". Although the above referenced patent and patent application disclose the movement of a switching fluid by means of dual push/pull actuating fluid cavities, a single push/pull actuating fluid cavity might suffice if significant enough push/pull pressure changes could be imparted to a switching fluid from such a cavity. In such an arrangement, the channel plate for the switch could be constructed similarly to the channel plate 100 disclosed herein.

The channel plate 1302 of the switch 1300 may have a plurality of channels 102–110 formed therein, as illustrated in FIGS. 1–3. In one embodiment of the switch 1300, the first channel 104 in the channel plate 100 (or 1302) defines at least a portion of the one or more cavities 1308 that hold the switching fluid 1318. By way of example, this switching fluid channel 104 may have a width of about 200 microns, a length of about 2600 microns, and a depth of about 200 microns.

A second channel (or channels 102, 106) may be formed in the channel plate 100 (or 1302) so as to define at least a portion of the one or more cavities 1306, 1310 that hold the actuating fluid 1320. By way of example, these actuating fluid channels 102, 106 may each have a width of about 350 microns, a length of about 1400 microns, and a depth of about 300 microns.

A third channel (or channels 108, 110) may be formed in the channel plate 100 (or 1302) so as to define at least a portion of one or more cavities that connect the cavities 1306–1310 holding the switching and actuating fluids 1318, 1320. By way of example, the channels 108, 110 that connect the actuating fluid channels 102, 106 to the switching fluid channel 104 may each have a width of about 100 microns, a length of about 600 microns, and a depth of about 130 microns.

An exemplary method 1400 for producing the switch 1300 illustrated in FIG. 13 is illustrated in FIG. 14. The method 1400 commences with the formation 1402 of at least one channel 102–110 in a channel plate 100 (or 1302). At least one of the channels 104 is then filled 1404 with a resist 500 that is not wetted by a material 800 that is to be deposited on the channel plate 100. Thereafter, the material 800 is deposited 1406 on at least a region of the channel plate 100 that at least abuts a portion of the resist 500. The material 800 may be applied in a variety of ways that include, for example, spin coating and spray coating.

After depositing the material 800, the resist 500 is removed 1408. Optionally, the deposited material 800 may be cured prior to removing the resist 500. Finally, the at least one channel 102–110 formed in the channel plate 100 (or 1302) is aligned with at least one feature on a substrate 1304, and at least a switching fluid 1318 is sealed 1410 between the channel plate 1302 and the substrate 1304, by means of the deposited material 800. As taught in FIG. 13, an actuating fluid 1320 may also be sealed between the channel plate 1302 and substrate 1304.

The material 800 deposited on the channel plate 1302 may be, for example, an adhesive or gasket material. One suitable adhesive is Cytop™ (manufactured by Asahi Glass Co., Ltd. of Tokyo, Japan). Cytop™ comes with two different adhesion promoter packages, depending on the application. When a channel plate 100 has an inorganic composition, Cytop™'s inorganic adhesion promoters should be used and an organic resist 500 should be used. Similarly, when a channel plate 100 has an organic composition, Cytop™'s organic adhesion promoters should be used, and an inorganic resist 500 should be used (including, possibly, an inorganic resist such as a thin sputtered-on coating of metal or glass).

Optionally, and as illustrated in FIGS. 15 & 16, portions of a channel plate 100 (or 1302) may be metallized (e.g., via sputtering or evaporating through a shadow mask, or via etching through a photoresist) for the purpose of creating "seal belts" 1502, 1504, 1506. Seal belts 1502–1506 may be created before or after the deposition of adhesive or gasket material on a channel plate 100. The creation of seal belts 1502–1506 within a switching fluid channel 104 provides additional surface areas to which a switching fluid may wet. This not only helps in latching the various states that a switching fluid can assume, but also helps to create a sealed chamber from which the switching fluid cannot escape, and within which the switching fluid may be more easily pumped (i.e., during switch state changes).

Additional details concerning the construction and operation of a switch such as that which is illustrated in FIG. 13 may be found in the afore-mentioned patent of Kondoh et al. and patent application of Marvin Wong.

FIG. 17 illustrates a second exemplary embodiment of a switch 1700. The switch 1700 comprises a channel plate 1702 defining at least a portion of a number of cavities 1706, 1708, 1710. The remaining portions of the cavities 1706–1710, if any, may be defined by a substrate 1704 to which the channel plate 1702 is sealed. Exposed within one or more of the cavities are a plurality of wettable pads 1712–1716. A switching fluid 1718 (e.g., a liquid metal such as mercury) is wettable to the pads 1712–1716 and is held within one or more of the cavities. The switching fluid 1718 serves to open and block light paths 1722/1724, 1726/1728 through one or more of the cavities, in response to forces that are applied to the switching fluid 1718. By way of example, the light paths may be defined by waveguides 1722–1728 that are aligned with translucent windows in the cavity 1708 holding the switching fluid. Blocking of the light paths 1722/1724, 1726/1728 may be achieved by virtue of the switching fluid 1718 being opaque. An actuating fluid 1720 (e.g., an inert gas or liquid) held within one or more of the cavities serves to apply the forces to the switching fluid 1718.

Forces may be applied to the switching and actuating fluids 1718, 1720 in the same manner that they are applied to the switching and actuating fluids 1718, 1720 in FIG. 13.

The channel plate 1702 of the switch 1700 may have a plurality of channels 102–110 formed therein, as illustrated in FIGS. 1–3. In one embodiment of the switch 1700, the first channel 104 in the channel plate 100 (or 1702) defines at least a portion of the one or more cavities 1708 that hold the switching fluid 1718.

A second channel (or channels 102, 106) may be formed in the channel plate 100 (or 1702) so as to define at least a portion of the one or more cavities 1706, 1710 that hold the actuating fluid 1720.

A third channel (or channels 108, 110) may be formed in the channel plate 100 (or 1702) so as to define at least a portion of one or more cavities that connect the cavities 1706–1710 holding the switching and actuating fluids 1718, 1720.

Additional details concerning the construction and operation of a switch such as that which is illustrated in FIG. 17 may be found in the afore-mentioned patent of Kondoh et al. and patent application of Marvin Wong. Furthermore, an adhesive or gasket layer, as well as seal belts, may be applied to the switch's channel plate 1702 as described supra, and as shown in FIGS. 14–16.

The use of channel plates is not limited to the switches 1300, 1700 disclosed in FIGS. 13 & 17 and may be undertaken with other forms of switches that comprise, for example, 1) a channel plate defining at least a portion of a number of cavities, a first cavity of which is defined by an ultrasonically milled channel in the channel plate, and 2) a switching fluid, held within one or more of the cavities, that is movable between at least first and second switch states in response to forces that are applied to the switching fluid.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A switch, produced by:
   a) forming at least one channel in a channel plate;
   b) filling at least one of the channels with a resist that is not wetted by a material that is to be deposited on the channel plate;
   c) depositing the material on at least a region of the channel plate that at least abuts a portion of the resist, the material registering with at least one channel edge as a result of the material's abutment to the resist;
   d) removing the resist; and
   e) aligning the at least one channel formed in the channel plate with at least one feature on a substrate, and sealing, by means of the deposited material, at least a switching fluid between the channel plate and the substrate.

2. The switch of claim 1, further comprising, curing the deposited material prior to removing the resist.

3. The switch of claim 1, wherein the deposited material is an adhesive.

4. The switch of claim 1, wherein the deposited material is a gasket material.

5. The switch of claim 1, wherein the material is deposited by means of spin coating.

6. The switch of claim 1, wherein the material is deposited by means of spray coating.

7. The switch of claim 1, wherein:
   a) a first channel formed in the channel plate is a channel for holding the switching fluid; and
   b) the channel for holding the switching fluid is filled with the resist.

8. The switch of claim 7, wherein:
   a) a second channel formed in the channel plate is an actuating fluid channel;
   b) the actuating fluid channel is filled with the resist; and
   c) the method further comprises sealing an actuating fluid between the channel plate and the substrate, said actuating fluid serving to apply forces to said switching fluid to thereby change the state of said switching fluid.

9. The switch of claim 1, wherein:
   a) the at least one channel formed in the channel plate comprises a channel for holding the switching fluid, a pair of channels for holding an actuating fluid, said actuating fluid serving to apply forces to said switching fluid to thereby change the state of said switching fluid, and a pair of channels connecting corresponding ones of the channels holding the actuating fluid to the channel holding the switching fluid; and
   b) all of the channels are filled with the resist.

10. A channel plate for a switch, comprising:
    a) at least one channel formed therein;
    b) a removable resist filling at least one of said channels, the resist being unwettable by a material that is to be deposited on the channel plate;
    c) said material, deposited on at least a region of the channel plate that at least abuts a portion of the resist, the material thereby registering with at least one channel edge as a result of the material's abutment to the resist.

11. The channel plate of claim 10, wherein the deposited material is an adhesive.

12. The channel plate of claim 10, wherein the deposited material is a gasket material.

* * * * *